United States Patent

Murakami et al.

Patent Number: 5,905,411
Date of Patent: May 18, 1999

[54] NUMERICALLY CONTROLLED OSCILLATOR CIRCUIT

[75] Inventors: Kurenai Murakami; Kaoru Yoshida, both of Tokyo, Japan

[73] Assignee: NEC Corporation, Japan

[21] Appl. No.: 08/931,202

[22] Filed: Sep. 16, 1997

[30] Foreign Application Priority Data

Sep. 17, 1996 [JP] Japan .................................. 8-245027

[51] Int. Cl.$^6$ ....................................................... H03L 7/06
[52] U.S. Cl. .............................................. 331/18; 331/25
[58] Field of Search ........................................ 331/18, 25

[56] References Cited

U.S. PATENT DOCUMENTS 5,517,534  5/1996  Knierim ...................................... 331/16
5,656,976  8/1997  Jung et al. ................................. 331/25

FOREIGN PATENT DOCUMENTS 1-114122  5/1989  Japan .
7-38570   2/1995  Japan .
7-66814   3/1995  Japan .
9-247157  9/1997  Japan .

OTHER PUBLICATIONS

K. Murakami, "Jitter in Synchronous Residual Time Stamp", IEEE Transactions on Communication, vol. 44, No. 6, Jun. 1996, pp. 742–748.

R.C. Lau, et al., "Synchronous Techniques for Timing Recovery in BISDN", IEEE Transactions on Communication, vol. 43, No. 2/3/4, Feb./Mar./Apr. 1995, pp. 1810–1818.

Primary Examiner—Siegfried H. Grimm
Attorney, Agent, or Firm—Ostrolenk, Faver, Gerb & Soffen, LLP

[57] ABSTRACT

A numerically controlled oscillator including an RTS value producing circuit which produces a series of residual time stamp (RTS) values indicative of a relation between the setting value and an actual oscillation frequency. A pulse train generator generates a pulse train in a period corresponding to the produced series of RTS values and a phase synchronous oscillator oscillates at a frequency in synchronism with the pulse train output from the pulse train generator. Preferably, the pulse train generated by the pulse train generator is supplied to the RTS value producing circuit as a signal indicative of the actual oscillation frequency.

5 Claims, 6 Drawing Sheets

NUMERICALLY CONTROLLED OSCILLATOR CIRCUIT

BACKGROUND OF THE INVENTION

1. Field of the Invention

The present invention relates to a numerically controlled oscillator circuit capable of numerically controlling an oscillation frequency. Oscillation frequency of the numerically controlled oscillator circuit is determined by an externally supplied digital value and is used in, for example, a frequency synthesizer, etc.

2. Description of the Related Art

A well known example of the conventional numerically controlled oscillator circuit is one disclosed in FIG. 6 of Japanese Patent Application Laid-open No. H1-114122 as a prior art of the invention disclosed thereby and has been utilized practically. A circuit construction of the prior art example is shown in FIG. 1. In FIG. 1, the conventional numerically controlled oscillator circuit is constructed with an accumulator 40, a read-only memory (ROM) 43 and a digital-to-analog (D/A) converter 44. The accumulator 40 is constructed with a Q-bit adder 41 and a Q-bit shift register 42 for holding a result of the addition from the Q-bit adder 41. A setting value represented by Q bits is externally supplied to an input terminal 101 of the accumulator 40 and a system clock having frequency $f_m$ is input to an input terminal 103 thereof to control a latching operation of the Q-bit shift register 42, that is, a latching operation of the accumulator 40. Therefore, when a constant value K is input to the input terminal 101 of the accumulator 40, an output of the accumulator 40 is increased by the constant value K every time period of $1/f_m$. The Q-bit adder 42 operates on modulo $2^Q$ to return the output of the accumulator 40 to 0 every $2^Q$. Therefore, an output waveform of the Q-bit adder 42 is sawtooth. The ROM 43 stores, for example, a digital value of $\sin(2\pi A/2^Q)$ in an address A thereof. Since the output of the accumulator 40 gives a phase of a sine wave and $2\pi$ radian corresponds to the digital value $2^Q$, an output of the ROM 43 becomes a train of numerical values indicative of a sine wave having a constant frequency. The train of the numerical values output from the ROM 43 is converted into an analog signal by the D/A converter 44, resulting in a sine wave signal at the output terminal 102. The system clock at the input terminal 103 of the accumulator 40 is also supplied to the D/A converter 44 to provide a timing for executing a D/A conversion. A frequency $f_0$ of the output of the D/A converter 44 is given by $f_0=f_m\times K/2^Q$. That is, the oscillator circuit shown in FIG. 1 is numerically controlled to oscillate at a frequency which is determined by the setting value K which is an externally supplied digital value.

FIG. 2 shows a construction of another conventional numerically controlled oscillator circuit. This construction corresponds to one shown in FIG. 1 of the aforementioned Japanese Patent Application Laid-open No. H1-114122. The oscillator circuit shown in FIG. 2 comprises an accumulator 40, a Q-bit register 45, a D/A converter 44, a voltage-controlled oscillator (VCO) 46 and a frequency divider (1/D) 47. The accumulator 40 is constructed with a Q-bit adder 41 and a Q-bit shift register 42. An operation of the accumulator 40 is similar to that of the accumulator shown in FIG. 1. The Q-bit register 45 performs a latching operation according to a clock obtained by an output clock of the VCO 46 divided by D by the frequency divider 47. Assuming that the oscillation frequency of the VCO 46 is constant and the Q-bit register 45 latches a sawtooth wave from the accumulator 40 always in same phases, the D/A converter 44 outputs a DC signal. Since this state corresponds to the state in which the oscillation frequency of the VCO 46 is constant, the system is in a stable state. On the other hand, if Q-bit register 45 latches the sawtooth wave from the accumulator 40 every time in slightly different phases, the output of the D/A converter 44 does not become a DC signal, so that the oscillation frequency of the VCO 46 shall be varied. As described in the aforementioned Japanese Patent Application Laid-open No. H1-114122 in detail, if the oscillation frequency of the VCO 46 varies in a direction in which the variation of phase for latching the output of the accumulator 40 by the Q-bit register 45 is restricted, the system ultimately becomes stable due to the principle of negative feedback and the oscillation frequency of the VCO 46 ultimately becomes constant. The frequency $f_0$ at an output terminal 102 is given by $f_0=D\times f_m\times K/2^Q$, where $f_m$ is a system clock frequency and K is a setting value input to an input terminal 101. In the circuit shown in FIG. 2, since the ROM for storing the sine wave data is unnecessary and the D/A converter 44 operates at a frequency which is 1/D of the oscillation frequency of the VCO 46, the oscillator circuit can operate at high frequency relatively easily.

In the oscillator circuit shown in FIG. 1, however, there is a problem that it is difficult to obtain a high frequency as the output thereof. That is, in order that the D/A converter 44 outputs a sine wave having frequency $f_0$, the clock frequency f at which the ROM 43 and the D/A converter 44 operate must be 2 times the oscillation frequency $f_0$ or more according to the known sampling theorem. Practically, however, in order to restrict high harmonic components of the output sine wave small enough, the clock frequency $f_m$ is preferably 5 times the oscillation frequency $f_0$ or more. Therefore, in order to obtain the oscillation frequency $f_0$ in the order of, for example, 50 MHz, the clock frequency $f_m$ is in a range from 100 MHz to 250 MHz or more. It is, however, very difficult to operate the D/A converter 44 at such high frequency and, even if a D/A converter 44 operable at such high frequency be realized, the D/A converter 44 has to be very expensive. Further, when the clock frequency $f_m$ is in a range from 100 MHz to 250 MHz, an access time to the ROM 43, which is also defined by the clock frequency $f_m$, becomes in a range from 4 ns to 10 ns which is very difficult to realize even if expensive ultra high speed memory elements are used.

On the other hand, the circuit shown in FIG. 2 does not require the ROM 43 and the operating frequency of the D/A converter 44 thereof is relatively low, and, therefore, it is possible to obtain a high oscillation frequency compared with the circuit shown in FIG. 1. However, in order to obtain high oscillation frequency, the D/A converter 44 of the oscillator circuit shown in FIG. 2 must be expensive. As mentioned above, the oscillation frequency of the VCO 46 is stabilized by the principle of negative feedback and phase noise is included in the output of the VCO 46 when the frequency dividing ratio D is large. In view of this, the frequency dividing ratio D is preferably 20 or less. In such case, when the oscillation frequency is 50 MHz, the operating frequency of the D/A converter 44 must be about 2.5 MHz. However, a D/A converter 44 operable at 2.5 MHz is not inexpensive but rather relatively expensive. In this sense, the oscillator circuit shown in FIG. 2 is not suitable in obtaining a high frequency output.

Since both of the oscillator circuits shown in FIGS. 1 and 2 require the D/A converter 44, it is difficult to fabricate it as a digital LSI. That is, when the oscillator circuit is made as an LSI, the LSI includes digital circuit portions and analog circuit portions and it is very difficult to fabricate such an LSI using an inexpensive gate array.

An object of the present invention is to provide a numerically controlled oscillator circuit which does not require an expensive D/A converter, is easily capable of obtaining high frequency output easily and can be fabricated in an LSI.

SUMMARY OF THE INVENTION

In the ITU-T Recommendation I.363, AAL type 1 is defined as ATM Adaptation Layer (AAL) in receiving a Constant Bit Rate (CBR) signal in the ATM communication system. As one of functions of the AAL type 1, there is a transfer function of a clock information of a user signal. In the Recommendation I.363, a Synchronous Residual Type Stamp (SRTS) method is defined as a method for this function. According to the SRTS method, a transmitter side produces a Residual Time Stamp (RTS) value and notifies the RTS value to a receiver side and the receiver side generates a pulse signal for driving a phase synchronous oscillator on the basis of the RTS value with which the clock of the user signal is reproduced.

The present invention applies the SRTS method to a numerically controlled oscillator circuit. According to the present invention, the numerically controlled oscillator circuit whose oscillation frequency is controlled by an externally supplied setting value is featured by comprising RTS value producing means for producing a series of residual time stamp (RTS) values indicative of a relation between the setting value and an actual oscillation frequency, pulse train generator means for generating a pulse train in a period corresponding to the produced series of RTS values and phase synchronous oscillator means for oscillating at a frequency in synchronism with the pulse train output from the pulse train generator means. Preferably, the pulse train generated by the pulse train generator means is supplied to the RTS value producing means as a signal indicative of the actual oscillation frequency.

The SRTS method defined by the Recommendation I.363 is not to control the oscillation frequency for the setting value but to recover, on the receiving side, the clock of the user signal used in the transmitter side. Therefore, the production of the series of RTS values by the RTS value producing means in the present invention is different from the RTS value producing method in the SRTS method. That is, contrary to the SRTS method in which the series of RTS values is produced from the clock of the user signal and a system clock which is also used to recover the clock in the receiver side, the series of the RTS values is generated from not the system clock but the setting value and an actually generated user clock which corresponds to the reproduced clock in the receiver side according to the Recommendation I.363, in the present invention. By generating such series of the RTS values, it is possible to generate a pulse train having a period corresponding to that of the series of RTS values in the same manner as that of the SRTS method and to obtain an oscillation output having a frequency synchronized with the pulse train.

The RTS value producing means may comprise a first accumulator for repetitively adding a first setting value every clock having a predetermined relation to an actual oscillation frequency and a second accumulator for repetitively adding a second setting value every the same clock and for adding a carry when the latter is output from the first accumulator. The first setting value may be used for a fine regulation and the second setting value may be used for a coarse regulation. Alternatively, one of the first and second setting values may be fixed.

The numerically controlled oscillator circuit according to the present invention does not require a ROM and a D/A converter which are difficult to operate at high speed, can easily generate a high frequency and can restrict the cost thereof. Further, there is no need providing any analog circuits other than the phase synchronous oscillator means. Further, since the phase synchronous oscillator means is commercially available as a unit, it is possible, according to the present invention, to make other circuits than the phase synchronous oscillator means in an LSI. When the phase synchronous oscillator means is realized by using the digital technique, it is possible to provide the whole numerically controlled oscillator circuit as an LSI.

DETAILED DESCRIPTION OF THE PREFERRED EMBODIMENT

Before describing the embodiment of the present invention, the SRTS method will be described briefly with reference to FIG. 3.

Figure 1:
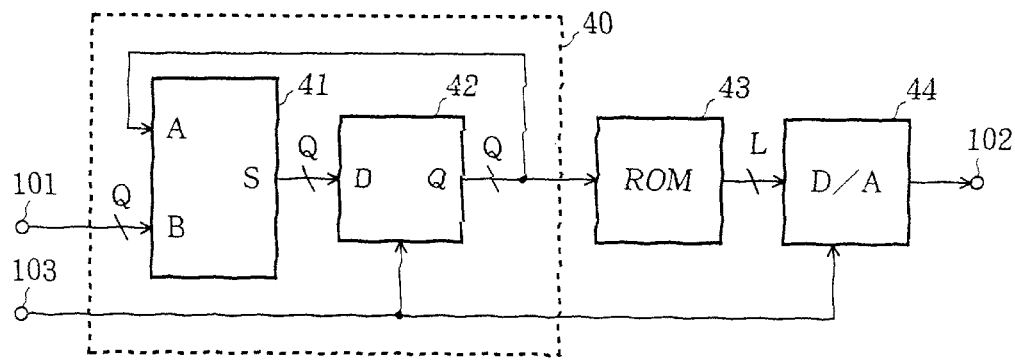
FIG. 1 is a block circuit diagram of a conventional numerically controlled oscillator circuit.
Figure 2:
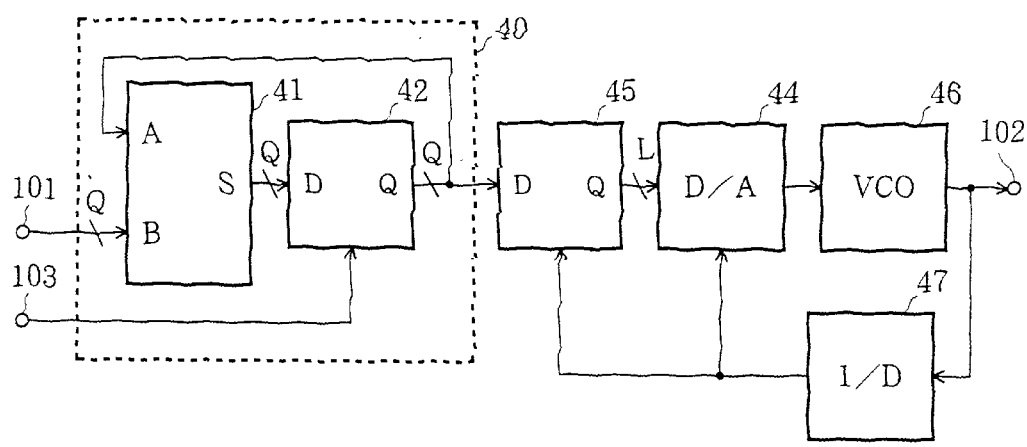
FIG. 2 is a block circuit diagram of another conventional numerically controlled oscillator circuit.
Figure 3:
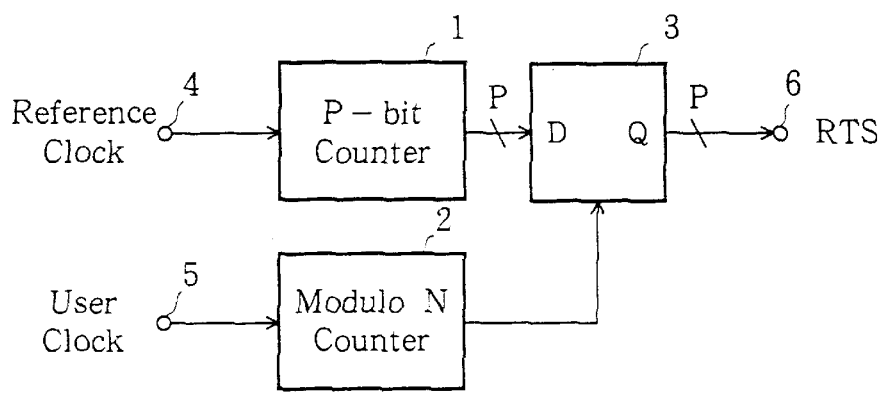
FIG. 3 is a block circuit diagram of an example of a circuit for producing RTS values on the side of a transmitting side in the SRTS method.

An RTS value producing circuit shown in FIG. 3 comprises a P-bit counter 1 driven by a reference clock input to a terminal 4, a modulo N counter 2 driven by a user clock input to a terminal 5 and a P-bit register 3 for latching an output of the P-bit counter 1 by an output of the modulo N counter 2. The modulo N counter 2 supplies a clock pulse to the P-bit register 3 when it counts N clocks. The P-bit register 3 latches the output of the P-bit counter 1 and outputs it to a terminal 6 as a produced RTS value.

A period in which the P-bit register 3 latches the output of the P-bit counter 1 is $N/f_g$, during which the P-bit counter 1 is increased in average by $M=(Nf_{nx})/f_g$, where $f_{nx}$ is a frequency of the reference clock and $f_g$ is a frequency of the user clock. The P-bit counter 1 is increased by $M_q$ or $M_q+1$ within a time $N/f_g$ and the P-bit counter 1 is increased by $M_q+1$ at a rate of once $1/R$ times in average, where $M_q$ is an integer portion of M and R is a decimal portion of M. Therefore, a difference between adjacent RTS values produced is $M_q$ mod $2^P$ or $(M_q+1)$ mod $2^P$ and it becomes $(M+1)$ mod $2^P$ at a rate of once $1/R$ times, where R is referred to as residue.

In the receiver side, the user clock frequency $f_g$ is recovered by $f_g=(Nf_{nx})/(M_q+R)$ from the RTS values produced in the transmitter side. This is described in detail in, for example, R. C. Lau and P. E. Fleischer, "Synchronous Techniques for Timing Recovery in BISDN", IEEE Transactions on Communication, Vol. 43, No. 2/3/4, pp. 1810–1818, February/March/April 1995 and K. Murakami, "Jitter in Synchronous Residual Time Stamp", IEEE Transactions on Communication, vol. 44, No. 6, pp. 742–748, June 1996.

According to the present invention, it is possible to generate a high frequency without utilizing the ROM and the D/A converter, whose high speed operations are difficult, by generating the series of STR values similar to that used in the SRTS method on the basis of the setting value externally supplied by a digital signal and the actually generated user clock. Embodiments of the present invention will be described below.

Figure 4:
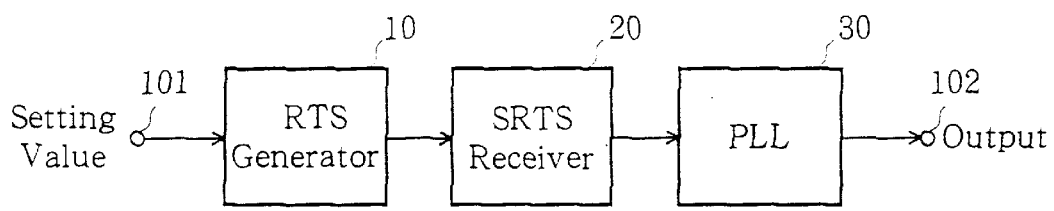
FIG. 4 is a block circuit diagram of a numerically controlled oscillator circuit according to an embodiment of the present invention.

FIG. 4 is a schematic block diagram of the numerically controlled oscillator circuit according to an embodiment of the present invention. This numerically controlled oscillator circuit comprises a RTS value generator circuit 10, a SRTS receiver circuit 20 and a phase synchronous oscillator circuit 30. The RTS value generator circuit 10 generates a series of RTS values according to a setting value supplied from an input terminal 101 and supplies it to the SRTS receiver circuit 20. The SRTS receiver circuit 20 generates a pulse train having a mean period determined by the series of RTS values and supplies it to the phase synchronous oscillator circuit 30. The phase synchronous oscillator circuit 30 oscillates at a frequency synchronized with the mean period of the pulse train and outputs it to an output terminal 102. Therefore, a signal having a frequency corresponding to the setting value input to the input terminal 101 appears at the output terminal 102. Since the series of BETS values is a digital signal, the RTS value generator circuit 10 can be constructed with a digital circuit and, by supplying the setting value to the input terminal as a digital value, it is possible to numerically control the frequency of the output signal at the output terminal 102.

Figure 5:
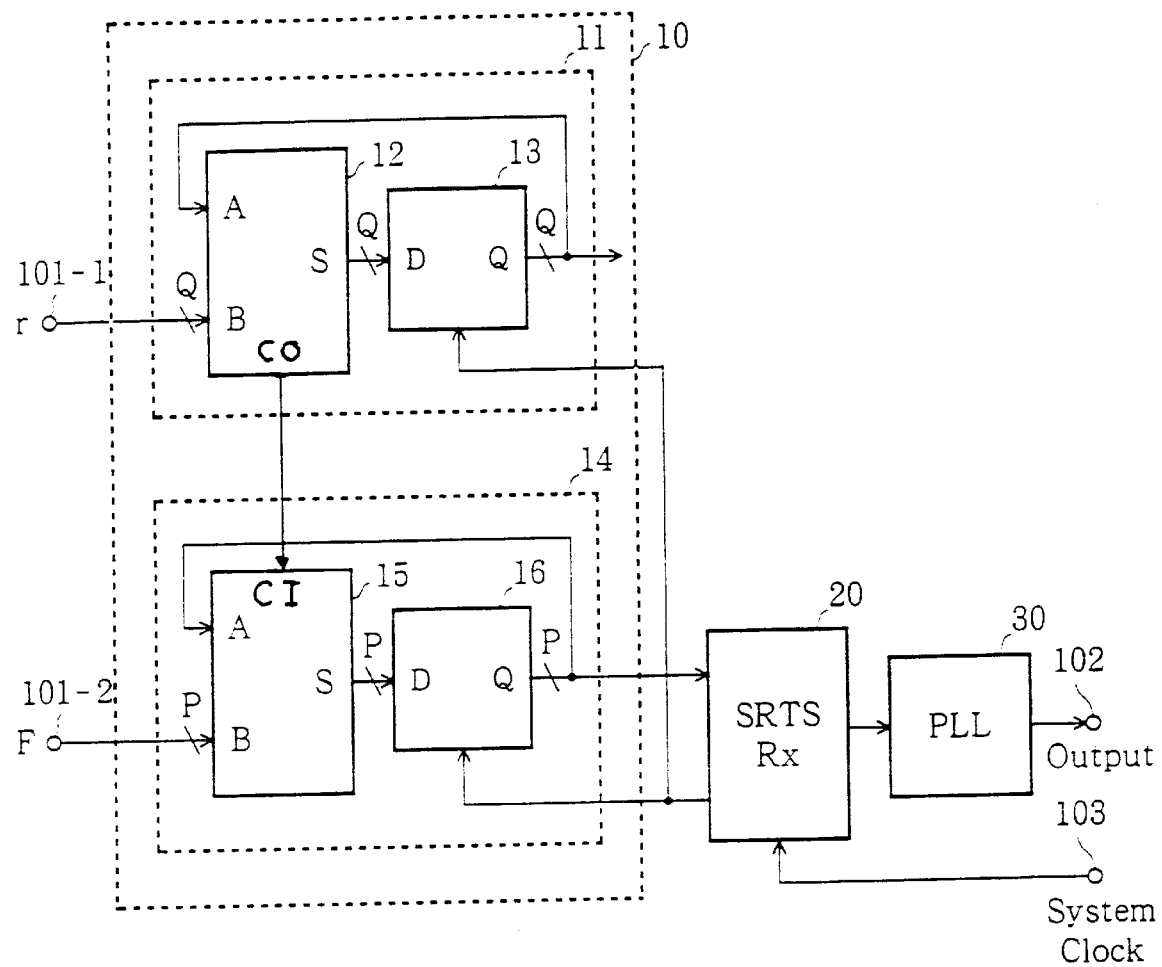
FIG. 5 is a block circuit diagram showing the embodiment in FIG. 4 in more detail.

FIG. 5 shows the circuit construction shown in FIG. 4 in more detail. The RTS value generator circuit 10 includes a first accumulator 11 and a second accumulator 14. A first setting value r is supplied to an input terminal 101-1 of the first accumulator 11 and a second setting value F is supplied to an input terminal 101-2 of the second accumulator 14. Further, an RTS request signal is supplied from the SRTS receiver circuit 20 to the first and second accumulators 11 and 14. The RTS request signal has a period equal to that of the pulse train supplied from the SRTS receiver circuit 20 to the phase synchronous oscillator circuit 30 or having a certain relation to that of the pulse train and, therefore, it has a predetermined relation to an actual oscillation frequency of the numerically controlled circuit.

The first accumulator 11 is constructed with a Q-bit adder 12 and a Q-bit register 13 and accumulates the first setting value r every time when the RTS request signal is input from the SRTS receiver circuit 20. The Q-bit adder 12 generates a carry when the accumulated value exceeds $2^Q$ and supplies it via output CO to the second accumulator 14 through input CI in adder 15. The Q-bit adder 12 generates the carry at an average rate of once $2^Q/r$ additions.

The second accumulator 14 is constructed with a P-bit adder 15 and a P-bit register 16 and accumulates the second setting value F every time when the RTS request signal is input from the SRTS receiver circuit 20. When the carry is input from the first accumulator 11, the second accumulator 14 is further incremented by +1. Therefore, a difference between adjacent outputs of the second accumulator 14 becomes, in modulo $2^P$, F+1 at a rate of once $2^Q/r$ times and, otherwise, F. From this, the series of values appearing at the output of the second accumulator 14 can be deemed as a series of RTS values having residue $R=r/2^Q$.

Figure 6:
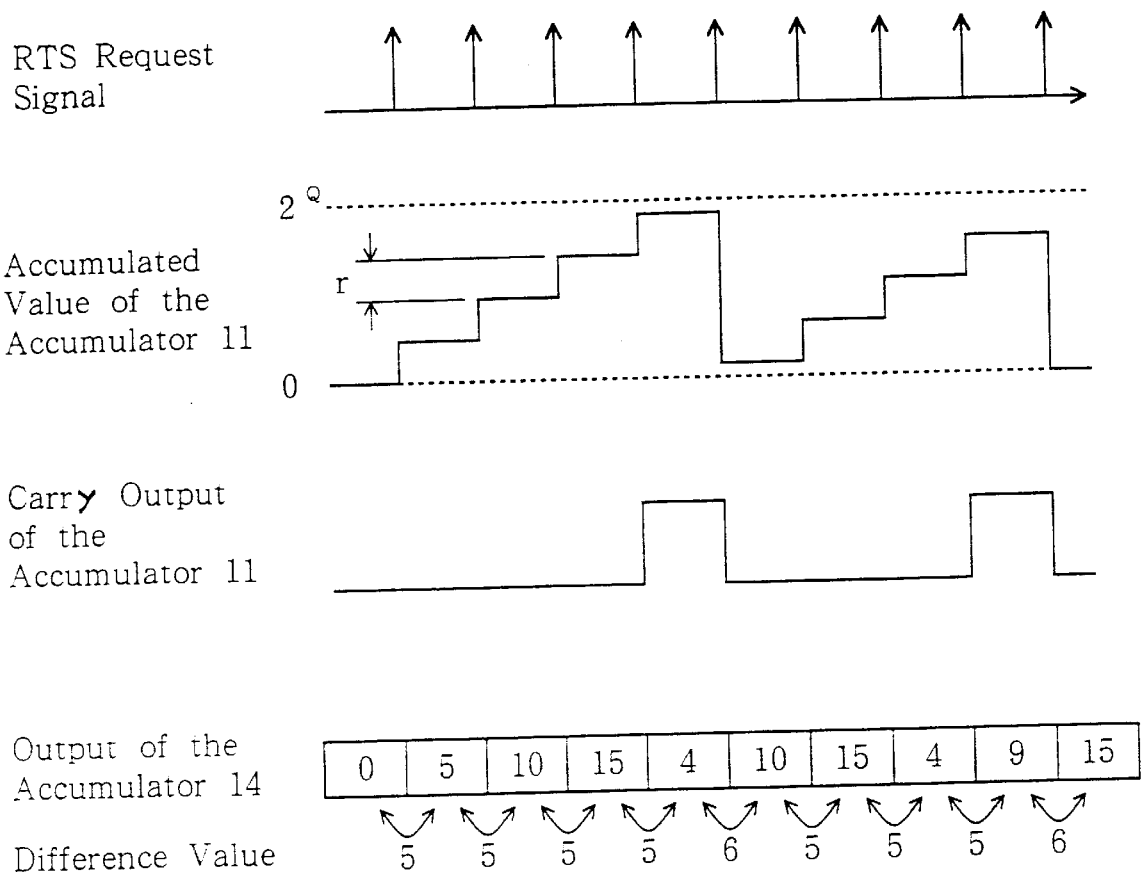
FIG. 6 shows signal waveforms at various points of the numerically controlled oscillator circuit according to the present invention.

The operation of the circuit shown in FIG. 5 will be described in detail with reference to FIG. 6. In FIG. 6, F=5 and P=4, that is, $2^P=16$. The accumulated value of the first accumulator 11 is increased by r by one accumulating operation. When the next accumulated value exceeds $2^Q$, the first accumulator 11 outputs a carry to the second accumulator 14. The second accumulator 14 accumulates F=5 and, when it receives the carry from the first accumulator 11, further adds 1. The second accumulator 14 outputs a value in modulo 16 of its accumulated value. Therefore, a difference value between adjacent outputs of the second accumulator is 5 when there is no carry from the first accumulator 11 and 6 when there is a carry from the first accumulator 11. The rate of the carry output from the first accumulator 11 is once $2^Q/r$ times and, therefore, it is clear that the output of the second accumulator 14 can be deemed as a series of RTS values.

Figure 7:
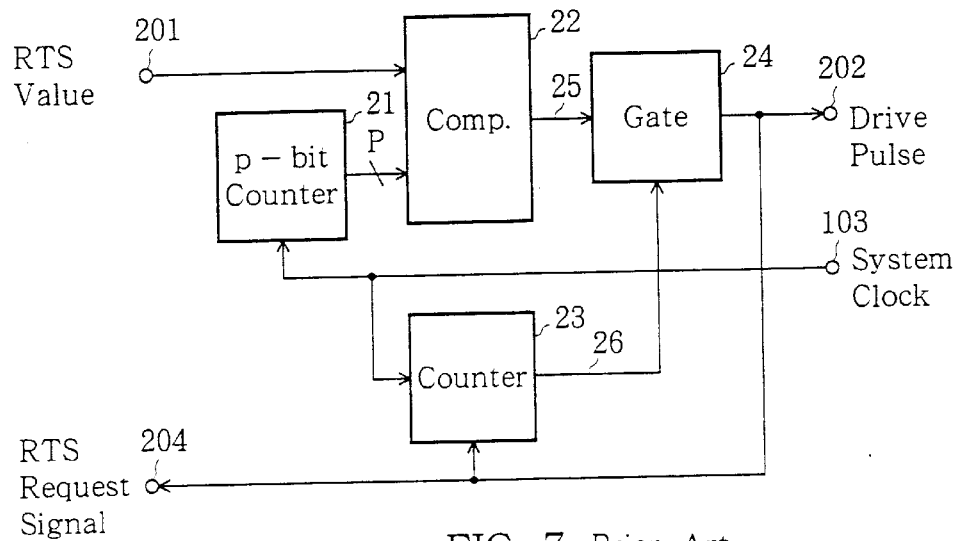
FIG. 7 is a block circuit diagram of a RTS receiving circuit of the numerically controlled oscillator circuit according to the present invention.
Figure 8:
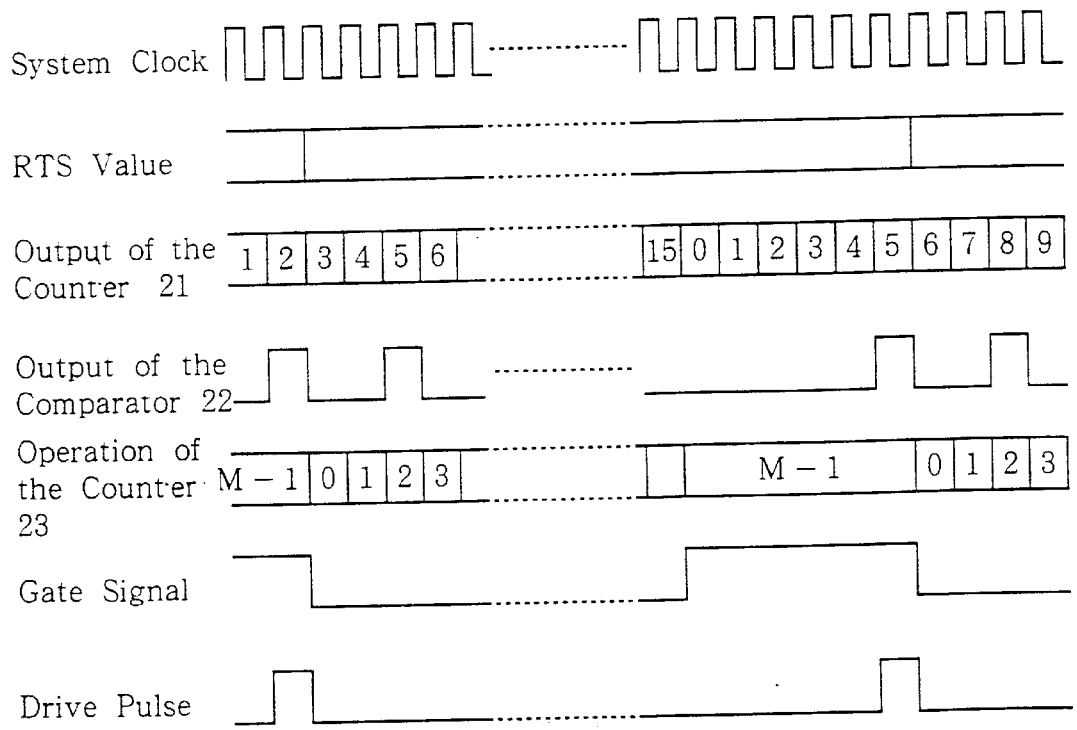
FIG. 8 shows signal waveforms at various points of the RTS receiving circuit shown in FIG. 7.

A conventional circuit used in the SRTS method for recovering the user clock may be utilized as the SRTS receiver circuit 20. FIG. 7 shows an example of such circuit which is disclosed in the previously mentioned article. FIG. 8 is a time chart showing an operation of the circuit shown in FIG. 7. In FIG. 7, the system clock is supplied to an input terminal 103 which is supplied to a first counter 21 and a second counter 23. The first counter 21 is a P-bit counter and counts from 0 up to $2^P-1$, repeatedly. In the time chart shown in FIG. 8, P=4, so that the first counter 21 counts from 0 up to 15, repeatedly. A comparator 22 compares the RTS value input from the terminal 201 with the output of the P-bit counter 21 and generates a pulse when the RTS value coincides with the output of the P-bit counter 21. Therefore, an output signal 25 of the comparator 22 becomes a pulse train as shown in FIG. 8. FIG. 8 shows a case where the RTS value is "5". The second counter 23 counts from 0 up to $M_L-1$ which is smaller than $M_q$. According to ITU-T Recommendation I.363, $M_L=M_q-2^{P-1}$. When the second counter 23 counts up to $M_L-1$, it stops to count and outputs a gate signal 26. A gate circuit 24 allows the pulse train 25 to pass therethrough when the gate signal 26 is supplied. A pulse passed through the gate circuit 24 is output to the terminal 202 as a drive pulse to be supplied to the phase synchronous oscillator circuit. The pulse is also used to restart the counting operation of the counter 23 from 0 and simultaneously stops the supply of the gate signal 26. Therefore, as will be clear from FIG. 8, the gate circuit 24 allows substantially only one pulse to pass therethrough. The pulse passed through the gate circuit 24 is also output to the terminal 204 as the RTS request signal and is used as a request signal for a new RTS value input from the terminal 201.

Figure 9:
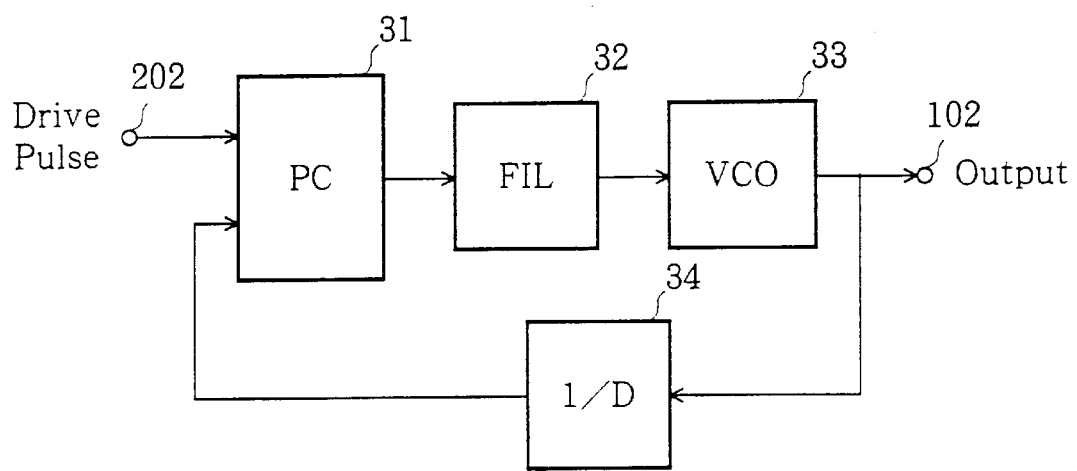
FIG. 9 is a block circuit diagram of an example of a phase synchronous oscillator circuit.

FIG. 9 shows a construction of the phase synchronous oscillator circuit 30. The phase synchronous oscillator circuit 30 includes a voltage-controlled oscillator 33. An oscillation output of the voltage-controlled oscillator 33 is supplied to the output terminal 102. An output frequency of the voltage-controlled oscillator 33 is divided by D by a 1/D frequency divider circuit 34. A phase comparator circuit 31 compares in phase the drive pulse supplied from the input terminal 202 with the output pulse of the 1/D frequency divider circuit 34 and outputs a result as a voltage value. The output of the phase comparator circuit 31 is smoothed by a filter 32 and supplied to the voltage-controlled oscillator 33 as a control signal. In the circuit construction shown in FIG. 9, the oscillation frequency of the voltage-controlled oscillator 33, that is, the frequency output to the output terminal 102 is given by $D \times f_n$ where $f_n$ is an average frequency of the drive pulse supplied to the terminal 202.

From the above description, the frequency $f_0$ at the output terminal 102 is given by the following equation:

$$f_0 = D f_j / \{M_q + (r/2^Q)\} \quad (1)$$

where D is a frequency dividing ratio of the phase synchronous oscillator circuit 30, $f_j$ is the system clock frequency and $M_q$ is an integer satisfying the following equation:

$$M_q = F \bmod 2^Q \quad (2)$$

There are a plurality of values of $M_q$ satisfying the equation (2) and the SRTS receiver circuit 20 selects one of them. For example, when the SRTS receiver circuit 20 has the construction shown in FIG. 7, the value of $M_q$ is the minimum integer among integers exceeding the count value $M_L$ of the counter 23 and satisfying the equation (2).

In the circuit shown in FIG. 5, the externally settable values for determining the oscillation frequency are r supplied to the input terminal 101-1 and F supplied to the input terminal 101-2. According to the equation (2), when F is changed by ±1, $M_q$ is usually changed by ±1. Therefore, the denominator of the equation (1) is also changed by ±1. On the other hand, when r is changed by ±1, the denominator of the equation (1) is changed by $½^Q$. That is, it is possible to finely set the output frequency by changing r rather than F. In the simplest way, F is fixed and r is made externally settable. Alternatively, it is possible to make r and F externally settable for a fine regulation and a coarse regulation, respectively. In the latter case, there is a further effect of expanding the oscillation frequency range. It is also possible to fix r and make only F settable, although an oscillation frequency step may be widened.

We claim:

1. A numerically controlled oscillator circuit having an oscillation frequency controllable by an externally supplied setting value, comprising:
    RTS value producing means for producing a series of residual time stamp (RTS) values indicative of a relation between the setting value and an actual oscillation frequency;
    pulse train generator means for generating a pulse train in a period corresponding to the produced series of RTS values; and
    phase synchronous oscillator means for oscillating at a frequency in synchronism with the pulse train output from said pulse train generator means.

2. A numerically controlled oscillator circuit as claimed in claim 1, wherein the pulse train generated by said pulse train generator means is supplied to said RTS value producing means as a signal indicative of the actual oscillation frequency.

3. A numerically controlled oscillator circuit as claimed in claim 1, wherein said RTS value producing means comprises a first accumulator for repetitively adding a first setting value every clock having a predetermined relation to an actual oscillation frequency and a second accumulator for repetitively adding a second setting value every the same clock and for adding a carry when the latter is output from said first accumulator.

4. A numerically controlled oscillator circuit as claimed in claim 3, wherein one of the first setting value and the second setting value is fixed.

5. A numerically controlled oscillator circuit as claimed in claim 2, wherein said RTS value producing means comprises a first accumulator for repetitively adding a first setting value every clock having a predetermined relation to an actual oscillation frequency and a second accumulator for repetitively adding a second setting value every the same clock and for adding a carry when the latter is output from said first accumulator.

* * * * *